(12) United States Patent
Rhie

(10) Patent No.: US 8,958,244 B2
(45) Date of Patent: Feb. 17, 2015

(54) SPLIT BLOCK DECODER FOR A NONVOLATILE MEMORY DEVICE

(71) Applicant: MOSAID Technologies Incorporated, Ottawa (CA)

(72) Inventor: Hyoung Seub Rhie, Ottawa (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

(21) Appl. No.: 13/836,028

(22) Filed: Mar. 15, 2013

(65) Prior Publication Data

US 2014/0104948 A1 Apr. 17, 2014

Related U.S. Application Data

(60) Provisional application No. 61/714,472, filed on Oct. 16, 2012.

(51) Int. Cl.
  *G11C 11/34* (2006.01)
  *G11C 16/08* (2006.01)
  *G11C 8/08* (2006.01)
  *G11C 11/408* (2006.01)
  *G11C 16/04* (2006.01)

(52) U.S. Cl.
  CPC ...... *G11C 16/08* (2013.01); *G11C 8/08* (2013.01); *G11C 11/4085* (2013.01); *G11C 16/0483* (2013.01)
  USPC ................................. 365/185.11; 365/185.24

(58) Field of Classification Search
  USPC ......................................... 365/185.11, 185.24
  See application file for complete search history.

(56) References Cited

U.S. PATENT DOCUMENTS

| 5,473,563 | A | 12/1995 | Suh et al. |
| 6,560,162 | B2 | 5/2003 | Kwon |
| 7,161,837 | B2 | 1/2007 | Park |
| 7,440,326 | B2 | 10/2008 | Ito |
| 7,468,916 | B2 * | 12/2008 | Chen ..................... 365/185.23 |
| 7,525,841 | B2 | 4/2009 | Aritome |
| 7,551,492 | B2 | 6/2009 | Kim |

(Continued)

FOREIGN PATENT DOCUMENTS

WO 2011137257 11/2011

OTHER PUBLICATIONS

Suh, K. et al, A 3.3 V 32 MB NAND Flash Memory With Incremental Step Pulse Programming Scheme, IEEE Journal of Solid-State Circuits, vol. 30, No. 11, Nov. 1995, pp. 1149-1156.

Tanaka, et al., "Bit Cost Scalable Technology with Punch and Plug Process for Ultra High Density Flash Memory", Center for Semiconductor Research and Development and Process and Manufacturing Engineering Center, Toshiba Corporation, Semiconductor Company, 2007 Symposium on VLSI Technology Digest of Technical Papers, Jun. 2007, pp. 14-15.

(Continued)

*Primary Examiner* — Michael Tran
(74) *Attorney, Agent, or Firm* — Shin Hung; Borden Ladner Gervais LLP

(57) ABSTRACT

A non-volatile memory device having a memory array organized into a plurality of memory blocks, having either planar memory cells or stacks of cells. Row decoding circuitry of the memory device is configured to select a group of the plurality of memory blocks in response to a first row address, and to select a memory block of the group for receiving row signals in response to a second row address. Row decoding circuitry associated with each group of memory blocks can have a row pitch spacing that is greater than a row pitch spacing of a single memory block and less than or equal to a total row pitch spacing corresponding to the group of memory blocks.

32 Claims, 10 Drawing Sheets

(56) References Cited

U.S. PATENT DOCUMENTS

| | | | |
|---|---|---|---|
| 7,813,169 | B2 | 10/2010 | Kux et al. |
| 7,813,184 | B2 | 10/2010 | Kim et al. |
| 7,852,676 | B2 | 12/2010 | Maejima |
| 7,869,256 | B2 * | 1/2011 | Park et al. ............... 365/148 |
| 7,885,115 | B2 | 2/2011 | Lee et al. |
| 7,940,578 | B2 | 5/2011 | Kang et al. |
| 7,944,752 | B2 | 5/2011 | Lee |
| 7,952,943 | B2 | 5/2011 | Cho |
| 7,978,518 | B2 | 7/2011 | Pyeon et al. |
| 7,994,011 | B2 | 8/2011 | Park et al. |
| 8,045,386 | B2 | 10/2011 | Santin et al. |
| 8,085,616 | B2 | 12/2011 | Ryu |
| 8,189,390 | B2 | 5/2012 | Kim |
| 8,189,391 | B2 | 5/2012 | Itagaki et al. |
| 8,199,573 | B2 | 6/2012 | Fukuzumi et al. |
| 8,203,211 | B2 | 6/2012 | Jeong |
| 8,203,882 | B2 | 6/2012 | Hishida et al. |
| 8,259,503 | B2 | 9/2012 | Park et al. |
| 8,264,031 | B2 | 9/2012 | Kidoh et al. |
| 8,278,170 | B2 | 10/2012 | Lee et al. |
| 8,278,695 | B2 | 10/2012 | Kidoh et al. |
| 2006/0083062 | A1 | 4/2006 | Park |
| 2010/0078701 | A1 | 4/2010 | Shim et al. |
| 2011/0170352 | A1 | 7/2011 | Kim |
| 2012/0181699 | A1 | 7/2012 | Chen et al. |
| 2012/0182802 | A1 | 7/2012 | Hung et al. |
| 2012/0182806 | A1 | 7/2012 | Chen et al. |

OTHER PUBLICATIONS

Jang, et al., "Vertical Cell Array using TCAT (Terabit Cell Array Transistor) Technology for Ultra High Density NAND Flash Memory" Advanced Technology Development Team 2 and Process Development Team, Memory R and D Center, Memory Division, Samsung Electronics Co. Ltd., 2009 Symposium on VLSI Technology Digest of Technical Papers, Jun. 2009, pp. 192-193.

Yoohyun Noh et al, "A New Metal Control Gate Last Process (MCGL Process) for High Performance DC-SF (Dual Control Gate with Surounding Floating Gate) 3D NAND Flash Memory", 2012 Symposium on VLSI Technology Digest of Technical Papers; Jun. 2012, pp. 19-20.

Fukuzumi, et al., "Optimal Integration and Characteristics of Vertical Array Devices for Ultra-High Density, Bit-Cost Scalable Flash Memory", Center for Semiconductor Research and Development, Toshiba Corporation, Semiconductor Company, Toshiba Information Systems (Japan) Corporation, Dec. 2007, pp. 449-452.

Akihiro Nitayama et al, "Bit Cost Scalable (BiCS) Flash Technology for Future Ultra High Density Storage Devices", VLSI Technology Systems and Applications (VLSI TSA), 2010 International Symposium, Apr. 2010, pp. 130-131.

Megumi Ishiduki et al, "Optimal Device Structure for Pipe-shaped BiCS Flash Memory for Ultra High Density Storage Device with Excellent Performance and Reliability", Electron Devices Meeting (IEDM), 2009 IEEE International, Dec. 2009, pp. 27.3.1-27.3.4.

Yosuke Komori et al, "Disturbless Flash Memory due to High Boost Efficiency on BiCS Structure and Optimal Memory Film Stack for Ultra High Density Storage Device", 2008 Electron Devices Meeting, Dec. 2008, pp. 1-4.

Ryota Katsumata et al, "Pipe-shaped BiCS Flash Memory with 16 Stacked Layers and Multi-Level-Cell Operation for Ultra High Density Storage Devices", 2009 VLSI Technology Symposium, Jun. 2009, pp. 136-137.

Ki-Tae Park et al, "A 45nm 4Gb 3-Dimensional Double-Stacked Multi-Level NAND Flash Memory with Shared Bitline Structure", Solid-State Circuits Conference, ISSCC 2008 Digest of Technical Papers, pp. 510-511 and 632, Feb. 6, 2008.

Jin-Ki Kim et al, "A 120mm2 64Mb NAND Flash Memory Achieving 180ns/Byte Effective Program Speed", 1996 Symposium on VLSI Circuits Digest of Technical Papers, Jun. 1996, pp. 168-169.

Lee, June et al, "High-Performance 1-GB NAND Flash Memory With .012-um Technology", IEEE Journal of Solid-State Circuits, vol. 37, No. 11, Nov. 2002, pp. 1502-1509.

Ki-Tae Park et al, "A Novel NAND Flash Memory With Asymmetric S/D Structure Using Fringe-Field-Induced Inversion Layer", IEEE Transactions on Electron Devices, vol. 55, Issue 1, pp. 404-410, Jan. 1, 2008.

Lue, et al., "A Novel Junction-Free BE-SONOS NAND Flash"; Emerging Central Lab, Technology Development Center, Macronix International Co., Ltd.; 2008 Symposium on VLSI Technology Digest of Technical Papers; IEEE; Jan. 2008, pp. 140-141.

Chang-Hyoun Lee et al, "Highly Scalable NAND Flash Memory with Robust Immunity to Program Disturbance Using Symmetric Inversion-Type Source and Drain Structure", 2008 Symposium on VLSI Technology Digest of Technical Papers; Jun. 2008, pp. 118-119.

Lue, et al., "A Highly Scalable 8-Layer 3D Vertical-Gate (VG) TFT NAND Flash Using Junction-Free Buried Channel BE-SONOS Device", Emerging Central Lab, Technology Development Center, Macronix International Co., Ltd., 2010 Symposium on VLSI Technology Digest of Technical Papers, Jun. 2010, pp. 131-132.

Chang, et al., "Memory Architecture of 3D Vertical Gate (3DVG) NAND Flash Using Plural Island-Gate SSL Decoding Method and Study of It's Program Inhibit Characteristics", Macronix International Co., Ltd., Emerging Central Lab, Technology Development Center, Design Center, IEEE, May 2012, pp. 1-4.

Dongyean Oh et al, "A New Self-Boosting Phenomenon by Soure/Drain Depletion Cut-off in NAND Flash Memory", 2007 IEEE Non-Volatile Semiconductor Memory Workshop, Aug. 2007, pp. 39-41.

Il Han Park et al, "Depletion-Enhanced Body-Isolation (DEBI) Array on SOI for Highly Scalable and Reliable NAND Flash Memories", IEEE Transactions on Nanotechnology, vol. 5, No. 3, May 2006, pp. 201-204.

Jung, T. et al, "A 117-MM2 3.3-V Only 128-MB Multilevel NAND Flash Memory for Mass Storage Applications", IEEE Journal of Solid-State Circuits, vol. 31, No. 11, Nov. 1996, pp. 1575-1583.

Hubert, et al., "A Stacked SONOS Technology, up to 4 Levels and 6nm Crystalline Nanowires, with Gate-all-around or Independent Gates (PHI-Flash), Suitable for Full 3D Integration", CEA-LETI, Minatec, STMicroelectronics, IEEE, Dec. 2009, pp. 1-4.

Chen, et al., "A Highly Pitch Scalable 3D Vertical Gate (VG) NAND Flash Decoded by a Novel Self-Aligned Independently Controlled Double Gate (IDG) String Select Transistor (SSL)", Emerging Central Lab, Technology Development Center, Macronix International Co., Ltd., 2012 Symposium on VLSI Technology Digest of Technical Papers, Jun. 2012, pp. 91-92.

Chen, et al., "A Highly Scalable 8-layer Vertical Gate 3D NAND with Split-page Bit Line Layout and Efficient Binary-sum MiLC (Minimal Incremental Layer Cost) Staircase Contacts", Macronix International Co., Ltd., IEEE, Dec. 2012, pp. 1-4.

Hung, et al., "Design Innovations to Optimize the 3D Stackable Vertical Gate (VG) NAND Flash", Macronix International Co., Ltd., IEEE, Dec. 2012, pp. 1-4.

Hyun-Jin Cho et al, "Modeling of Surrounding Gate MOSFETs With Bulk Trap States", IEEE Transactions on Electron Devices, vol. 54, No. 1, Jan. 2007, pp. 166-169.

Andrew Walker, "Sub-50-nm Dual-Gate Thin-Film Transistors for Monolithic 3-D Flash", IEEE Transactions on Electron Devices, vol. 56, No. 11, Nov. 2009 , pp. 2703-2710.

Meikei Ieong et al, "DC and AC Performance Analysis of 25 nm Symmetric/Asymmetric Double-Gate, Back-Gate and Bulk CMOS", 2000 Simulation of Semiconductor Processes and Devices, Sep. 2000, pp. 147-150.

Hiroshi Nakamura et al, "A Novel Sense Amplifier for Flexible Voltage Operation NAND Flash Memories", 1995 Symposium on VLSI Circuits Digest of Technical Papers, Jun. 1995, pp. 71-72.

L. Crippa et al, "Nonvolatile Memories: NOR vs. NAND Architectures", Memories in Wireless Systems, Aug. 2008, pp. 29-53.

* cited by examiner

SPLIT BLOCK DECODER FOR A NONVOLATILE MEMORY DEVICE

CROSS REFERENCE TO RELATED APPLICATIONS

This application claims the benefit of U.S. Provisional Patent Appln No. 61/714,472 filed Oct. 16, 2012, which is hereby incorporated by reference.

FIELD

The present disclosure relates generally to semiconductor memory devices. More particularly, the present disclosure relates to non-volatile memory devices.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

A commonly used flash memory is NAND flash memory, in which groups of flash memory cells are serially connected with each other in a string between a bitline and a source line, and multiple strings receiving common row signals form a memory block. NAND flash memory offers a high bit density per unit area, especially when each cell stores multiple bits of data, thereby reducing the cost per bit for the NAND flash memory device. As should be well known to those skilled in the art, NAND flash memory arrays are typically formed on a plane of the substrate and thereby extend in a wordline and a bitline direction (ie. X and Y). These are referred to as a planar NAND flash memory array. Other factors for reducing the overall cost for a NAND flash memory device is to continue scaling down of device feature sizes using the most current lithography tools for reducing the physical cell size, and to increase the number of cells per string.

As the limits of semiconductor lithography are approached, new NAND flash memory fabrication methods have evolved to further reduce the cost per bit. One method is to increase the cell density by stacking the cells vertically on the semiconductor substrate. While this technique certainly increases cell density of a memory array, the reduced row pitch of each memory block relative to planar NAND flash memory blocks imposes new restrictions to certain circuits surrounding the memory array. These circuits are traditionally referred to as pitch-limited circuits as their layout is limited by the row pitch of the memory blocks, which are formed in the x-y plane of the substrate.

SUMMARY

In one aspect, the present disclosure provides a non-volatile memory device having a memory array and row decoding circuitry. The memory array includes a plurality of memory blocks organized as groups of memory blocks. The row decoding circuitry is configured to select a group of the plurality of memory blocks in response to a first row address and to select a memory block of the group for receiving row signals in response to a second row address. According to an embodiment of the present invention, the row decoding circuitry includes first decoder logic configured to provide a super block signal corresponding to each group of the plurality of memory blocks in response to the first row address, the row signals includes string select signals corresponding to each memory block of the group, and the non-volatile memory device further includes discharge devices for coupling each of the string select signals to ground when the group is unselected. In an aspect of this embodiment, each of the discharge devices is controlled by logic states of the super block signal. In another aspect of the present embodiment, the row signals includes ground select signals corresponding to each memory block of the group, the non-volatile memory device further including ground select discharge devices for coupling each of the ground select signals to ground when the group is unselected. Each of the ground select discharge devices can be controlled by the logic states of the super block signal. The non-volatile memory device can further include high voltage level shifters for voltage level shifting the super block signals.

In another embodiment of the first aspect, the row decoding circuitry includes a select logic unit configured to select the group addressed by the first row address and the memory block of the group addressed by the second row address. The first decoder logic and the select logic unit can be formed on one side of the memory array. The select logic unit is formed within a row pitch of the group, and the first row address includes higher order bits of a memory block address. In this embodiment, the row decoding circuitry includes second decoder logic configured to provide block signals corresponding to each memory block of the group in response to the second row address, where the block signals include block select signals corresponding to each memory block of the group, and row signals for accessing memory cells of each memory block of the group. In the current embodiment, the select logic unit includes a first stage selector configured to pass the row signals to a second stage selector in response to the super block signal, where the second stage selector is configured to selectively pass the row signals to one memory block of the group corresponding to the super block signal, in response to the block select signals. The discharge devices can be first discharge devices, and the non-volatile memory device further includes second discharge devices, where each of the second discharge devices couples a corresponding string select line to ground when the corresponding memory block of the group is unselected. Each of the second discharge devices can be controlled by logic states of a corresponding block select signal. Furthermore, the row signals can include ground select signals corresponding to each memory block of the group, and the non-volatile memory device further includes ground select discharge devices for coupling each of the ground select signals to ground when the corresponding memory block of the group is unselected. Each of the ground select discharge devices can be controlled by the logic states of the corresponding block select signal.

In the embodiment where the block signals include block select signals corresponding to each memory block of the group, and row signals for accessing memory cells of each memory block of the group, the second row address includes a wordline address and lower order bits of the memory block address. In this aspect of the embodiment, the second decoder logic includes a wordline address decoder for providing the row signals in response to the wordline address, and a block decoder for providing the block select signals in response to the lower order bits of the memory block address. The second decoder logic can further include a wordline driver for driving the row signals received from the wordline address decoder, and high voltage level shifters for voltage level shifting the block select signals.

In the embodiment where the row decoding circuitry includes second decoder logic configured to provide block signals corresponding to each memory block of the group in response to the second row address, the block signals include dedicated sets of row signals corresponding to each memory block of the group. In an aspect of this embodiment, the select logic unit includes a selector configured to couple the dedicated sets of row signals to a corresponding memory block of the group in response to the super block signal, and the second decoder logic includes an address decoder for providing the dedicated sets of row signals in response to the second row address, where the second row address includes a wordline address and lower order bits of the memory block address. The second decoder logic can include wordline drivers for driving one of the dedicated sets of row signals with voltage levels specific to a memory operation.

Alternately, the second decoder logic includes a wordline driver circuit for driving master row signals with voltage levels specific to a memory operation, a selector circuit for passing the master row signals as one of the dedicated sets of row signals in response to block select signals, and a block decoder for providing the block select signals in response to lower order bits of the memory block address. The discharge devices are first discharge devices, and the non-volatile memory device further includes second discharge devices, where each of the second discharge devices couples a corresponding string select line to ground when the corresponding memory block of the group is unselected. Furthermore, the row signals can include ground select signals corresponding to each memory block of the group, and the non-volatile memory device further includes ground select discharge devices for coupling each of the ground select signals to ground when the corresponding memory block of the group is unselected.

In the embodiment where the row decoding circuitry includes second decoder logic configured to provide block signals corresponding to each memory block of the group in response to the second row address, the first decoder logic includes a first portion formed on one side of the memory array and a second portion formed on an opposite side of the memory array. The first portion provides a first super block signal for selecting a first group of the memory blocks, and the second portion provides a second super block signal for selecting a second group of the memory blocks. In this aspect of the embodiment, the row decoding circuitry includes a first select logic unit formed on the one side of the memory array for selecting the first group of the memory blocks in response to the first super block signal, and a second select logic unit formed on the opposite side of the memory array for selecting the second group of the memory blocks in response to the second super block signals. The first select logic unit is configured to select a memory block of the first group in response to the block signals, and the second logic unit is configured to select a memory block of the second group in response to the block signals. In one embodiment, the first select logic unit is formed within a row pitch of the first group of the memory blocks, and the second logic unit is formed within a row pitch of the second group of the memory blocks. Alternately, the first select logic unit has a row pitch spacing greater than a row pitch of the first group of the memory blocks, and the second logic unit has a row pitch spacing greater than a row pitch of the second group of the memory blocks.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure is directed to a non-volatile memory device having a memory array organized into a plurality of memory blocks having either planar NAND cell strings or vertical channel NAND cell strings. Row decoding circuitry of the memory device is configured to select a group of the plurality of memory blocks in response to a first row address, and to select a memory block of the group for receiving row signals in response to a second row address. Row decoding circuitry associated with each group of memory blocks can have a row pitch spacing that is greater than a row pitch spacing of a single memory block and less than or equal to a total row pitch spacing corresponding to the group of memory blocks.

Figure 1:
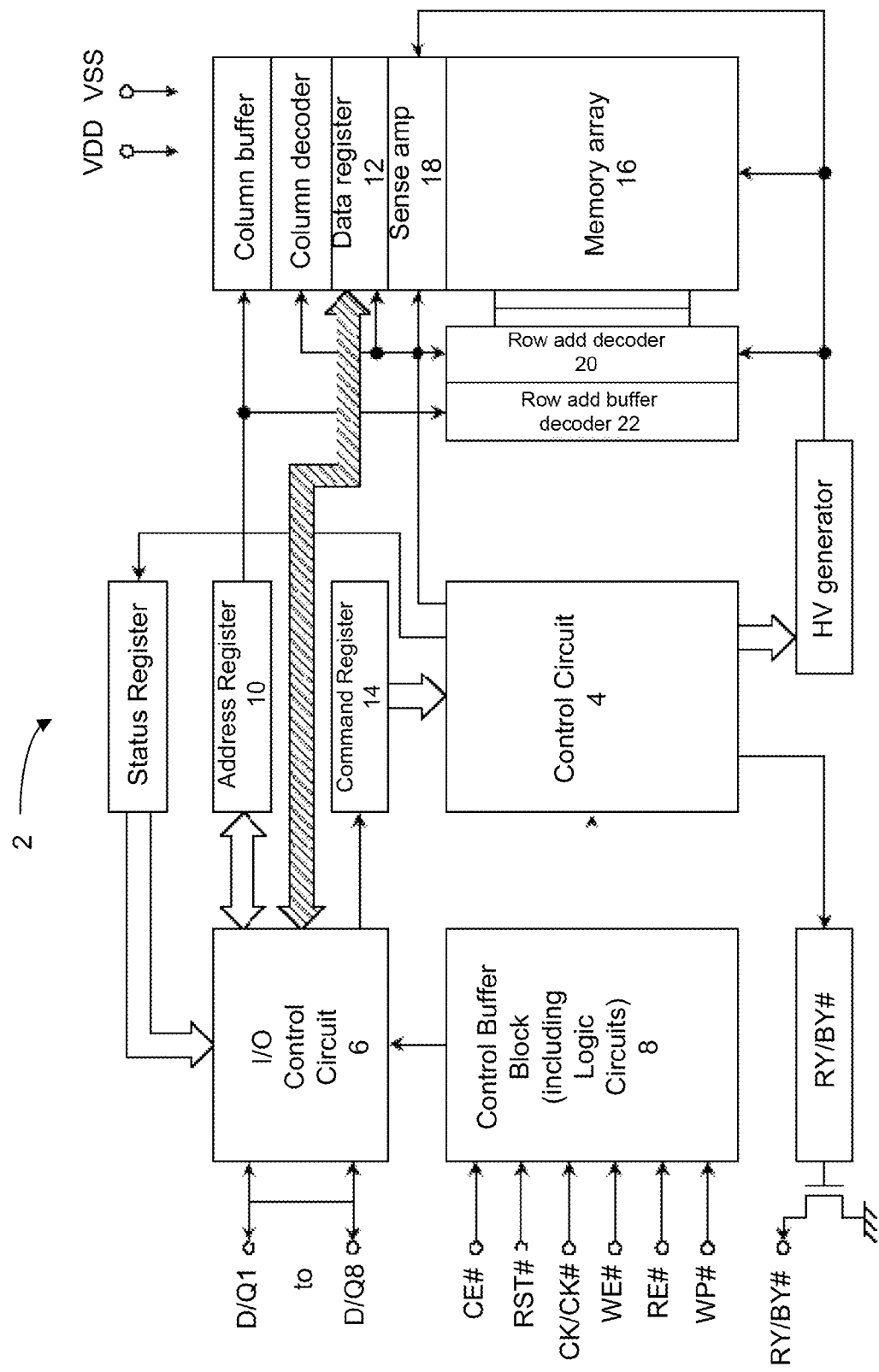
FIG. 1 is a block diagram of a flash memory device.

FIG. 1 is a general block diagram of a flash memory device which can incorporate the embodiments of the present disclosure. Flash memory 2 includes well known input and output buffer circuits, such as input/output (I/O) buffer block 6 and control buffer block 8 for receiving external control and data input signals and providing data output signals. The control buffer block 8 receiving the control signals, such as CE# and WE#, may include other basic logic circuits, for implementing rudimentary functions that may be related to control of the data input and buffers for example. Flash memory 2 includes control circuit 4, for controlling various high level functions of the flash circuits such as read, program and erase operations for example, an address register 10 for storing address information, a data register 12 for storing program data information, a command register 14 for storing command data information, high voltage circuits for generating the required program and erase voltages, and core memory circuits for accessing the memory array 16. Memory array 16 includes flash memory cells, arranged as NAND cell strings for example. The NAND cell strings of a column are coupled to a bitline, which is connected to a page buffer/sense amplifier circuit 18. Sense amplifier circuit 18 senses read data from a selected page of memory cells and provides program data to a selected page of memory cells. One page refers to the entirety of all data that is addressed by the least significant bit of the row address. In the most common embodiments all cells that constitute one page are connected to the same word line. In some embodiments one page of memory cells is identical to all the memory cells connected to the same word line. Driving the wordlines is row drivers/decoders, shown as a row address decoder 20 and row address buffer 22. There can be one or more stages of decoding, and row address buffer 22 can include block decoding logic.

The control circuit 4 includes a command decoder and logic for executing internal flash operations, such as read, program and erase functions. Those skilled in the art will understand that these operations are executed in response to the command data stored in the command register 14, sometimes in combination with the address data and program data stored in the respective address register 10 and data register 12, depending on the operation to be executed. The command data, address data and program data are issued by a memory controller and latched into the corresponding registers by flash memory 2. The functions of the shown circuit blocks of flash memory 2 are well known in the art. Persons skilled in the art will understand that flash memory 2 shown in FIG. 1 represents one possible flash memory configuration amongst many possible configurations. In FIG. 1, memory array 16, sense amplifier circuit 18, data register 12, row address decoder 20 and row address buffer 22 are part of one memory bank.

Figure 2:
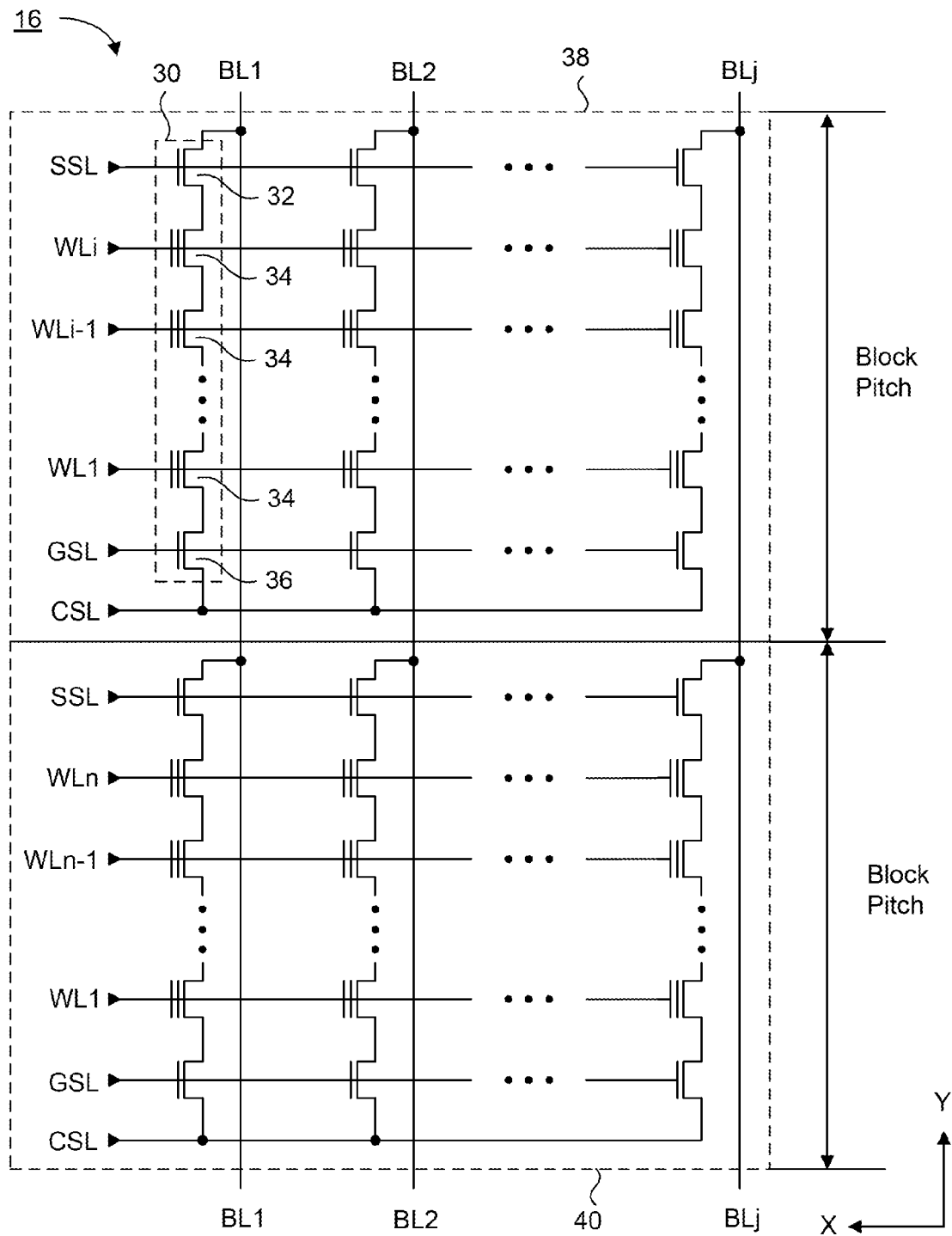
FIG. 2 is a circuit schematic of a NAND flash memory array.

FIG. 2 depicts an example of memory array 16 of FIG. 1. The example illustrated in FIG. 2 has two memory blocks in one memory array. In FIG. 2, one NAND cell string is outlined with a dashed box 30, which includes a string select device 32, flash memory cells 34, and a sourceline select device 36 connected in series between bitline BL1 and source line SL. There can be "i" flash memory cells 34 per NAND cell string, where "i" is a non-zero integer value indicating the last wordline of the cell string. Accordingly, wordlines WL1 to WLi are electrically coupled to corresponding gates of the flash memory cells 34. A string select line (SSL) and a ground select line (GSL) are electrically coupled to select devices 32 and 36 respectively. In the present example, all the transistors of the NAND cell string 30 are n-channel devices.

A memory block 38 includes all the NAND cell strings having select devices and flash memory cells connected to the same wordlines, string select line and ground select line. The width of memory block 38 is set by the number of bitlines, which in the case of FIG. 2 is "j" bitlines where j is a non-zero integer value. Memory block 40 includes further NAND cell strings connected to bitlines BL1 to BLj. A bitline and the NAND cell strings electrically connected to it is referred to as a column. The NAND cell strings shown in FIG. 2 are planar NAND cell strings, meaning that they are formed in the semiconductor substrate of the memory device. More specifically, semiconductor substrate surface has a plane defined by an x axis and a y axis, then the cells of the planar NAND cell strings are formed with dimensions extending in the x axis and the y axis.

Figure 3:
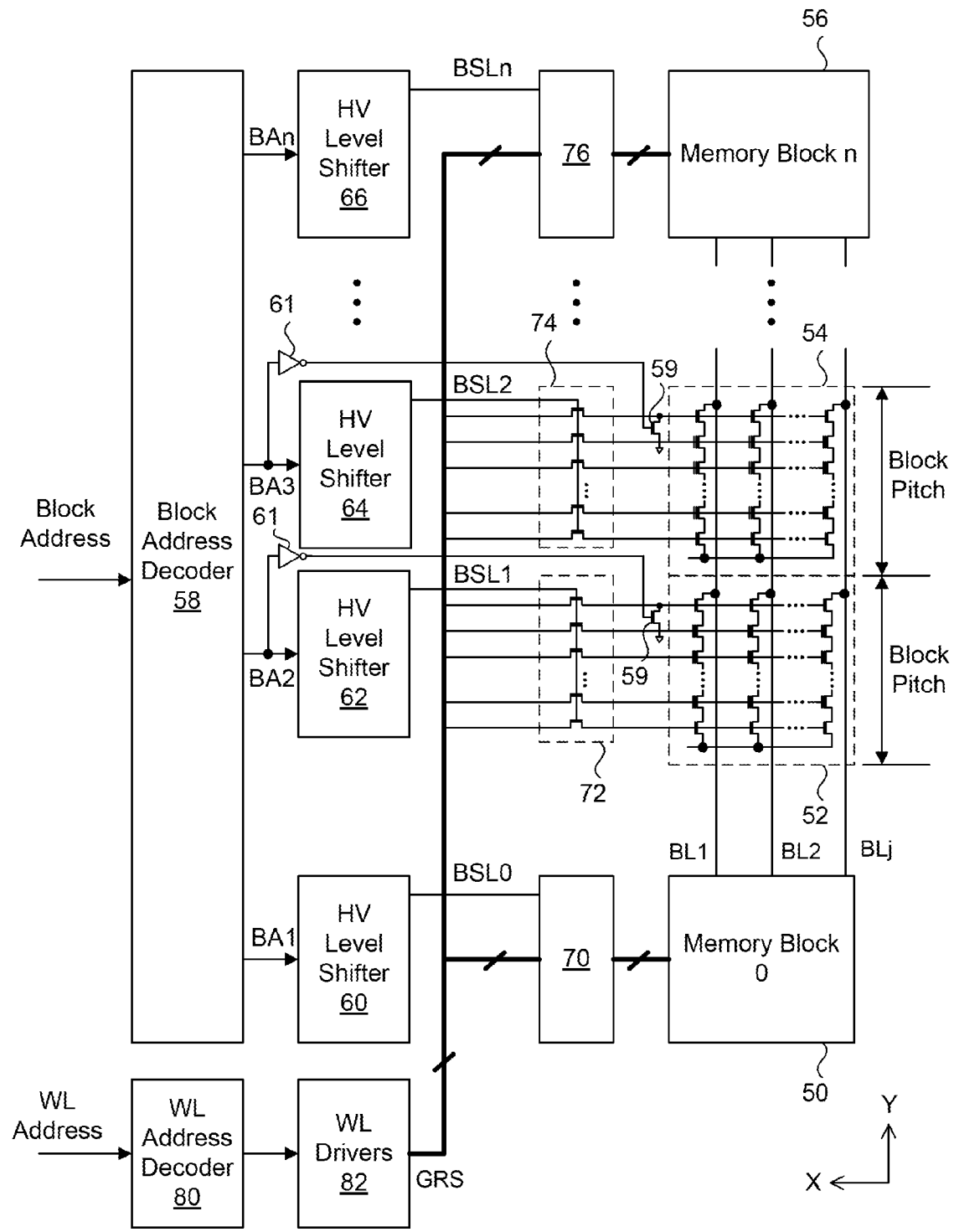
FIG. 3 is a block diagram of example row decoder circuits used in the flash memory device of FIG. 1.

FIG. 3 is a block diagram of example row decoder circuits for row address decoder 20 of FIG. 1. The memory array includes memory blocks 50, 52 and 54 to 56, where memory block 56 is the last memory block "n" in the memory array, where n is an integer value. Each memory block includes NAND cell strings having transistor devices sharing common row signals, such as wordline, string selection and ground selection lines, as shown in the detailed circuit schematic of memory blocks 52 and 54. Bitlines extend in a vertical direction and are connected to each of the NAND cell strings. Only bitlines BL1, BL2 and a last bitline BLj are shown in FIG. 3. NAND cell strings arranged in memory blocks are well known in the art, and a further discussion of their details is not required. The row decoder circuits include a block address decoder 58, high voltage level shifter circuits 60, 62 and 64 to 66, pass circuits 70, 72 and 74 to 76, a wordline address decoder 80, and wordline drivers 82. While not shown in FIG. 3, wordline drivers 82 receives different voltage levels, some of which are greater than the power supply voltage provided to the semiconductor memory device, for driving the row signals with. In FIG. 3, pass circuits 72 and 74 are shown with circuit details, where each includes a set of pass devices shown as n-channel transistors, having gate terminals receiving a respective block select signal such as BSL1 and BSL2.

The block address decoder 58 decodes a block address to provide block address signals BA1 to BAn. In the present example, only one block address signal BA1 to BAn is driven to the active voltage level in response to any block address during read and program operations. Each of the high voltage level shifters 60 to 66 receives one block address signal BA1 to BAn respectively, and shifts the voltage to a higher voltage range than provided by the circuits of block address decoder 58. The high voltage level shifters 60 to 66 can include charge pumps. Alternately, the high voltage level shifters can be transmitter circuits which transmit a high voltage provided from a global charge pump circuit (not shown) external to the row decoding circuitry. Such circuits are well known in the art. Each of the high voltage level shifters 60 to 66 therefore provides a level shifted block select signal BSL1 to BSLn to respective pass circuits 70 to 76. It is noted that only one of BSL1 to BSLn is driven to a high voltage level when the corresponding block address BA1 to BAn is driven to the active logic level by block address decoder 58. One of pass block circuits 70 to 76 is enabled when its respective block select signal BSL is driven to the high voltage level. The effect and purpose of the high voltage level block select signal is described later.

The wordline address decoder 80 decodes a wordline address to activate one global wordline of a set of global row signals GRS. GRS includes global wordlines G_WL[1:i] (G_WL1, G_WL2 to G_WLi), a global string select line G_SSL and a global ground select line G_GSL. The active and inactive GRS signals are provided to wordline drivers circuit 82. In the present example, memory blocks 50, 52 and 54 to 56 each include a total of "i" rows. The wordline drivers circuit 82 drives global wordlines G_WL[1:i] (G_WL1, G_WL2 to G_WLi), the global string select line G_SSL and the global ground select line G_GSL to all the pass circuits 70 to 76 in parallel. These signals are driven with the appropriate voltage levels ranging from VSS to various high voltages depending on the operation being executed, where the high voltages can be provided by charge pump circuits (not shown).

During read or program operations, a selected G_WL as determined by the wordline address decoder 80 is driven by the wordline drivers circuit 82 to the necessary voltage level to effect read or programming operations, while the remaining unselected wordlines, G_SSL and G_GSL are driven to other voltage levels required by the read or program operations. In order to transfer or pass the global row signals G_WL[1:i], G_SSL, and G_GSL to one of memory blocks 50, 52 and 54 to 56, one of corresponding pass circuits 70, 72 and 74 to 76 is enabled by a block select signal BSL driven to a high voltage level. The block select signal BSL can be driven to a voltage level higher than the maximum voltage level the global row signals GRS are driven to, in order to ensure that the full voltage level of the global row signals is passed to the selected memory block. The selected pass block circuit provides local wordline signals WL[1:i], a local string select signal SSL and a local ground select signal GSL to the NAND cell strings of the memory block. Due to this need to drive the block select signals BSL0 to BSLn to a high voltage level, the high voltage level shifter circuits 60, 62 and 64 to 66 are placed between the block address decoder 58 and the block select lines (BSL). Also, because the memory blocks are arranged in rows, the corresponding pass circuits and high voltage level shifter circuits are also arranged in rows.

It is noted that for unselected pass block circuits, the SSL line for connecting the NAND cell string to the bitline is held at VSS by a discharge device 59, shown in FIG. 3 as an n-channel transistor. Each discharge device 59 is turned on whenever the corresponding memory block is unselected, in order to decouple the NAND strings from the bitline. Hence, the discharge device 59 is turned off for a selected memory block. There can be different methods for turning on and off discharge device 59 under these conditions. In the configuration of FIG. 3, the block address signals are used to enable and disable the discharge devices 59 via inverters 61. If the block address signal is driven to an active high logic level to select a particular memory block, then the corresponding discharge device 59 is turned off. Otherwise, the block address signal at an inactive low logic level turns on the discharge device 59. For the purposes of simplifying the drawing of FIG. 3, only two discharge devices 59 and inverters 61 are shown, but would be included for the other SSL lines in the memory array. In other configurations, discharge devices can be provided for discharging the GSL lines under the same conditions as the SSL lines are discharged.

In the example of FIG. 3, the memory blocks consist of planar type NAND cell strings. More specifically, the memory cells are arranged on an X-Y plane of the semiconductor surface, where the X axis corresponds to a word line direction and the Y axis corresponds to a bit line direction. It can be seen in FIG. 3 that the memory block pitch, also referred to as row pitch, is determined mainly by the number of cells per NAND cell string. Therefore, as the number of cells connected in series in the NAND cell string increases, the block pitch will also increase in size. Because the current trend in NAND flash memory development is to increase the number of cells per NAND cell string, row circuits such as the high voltage level shifters and the pass circuits corresponding to each memory block, can be laid out within the block pitch with ease. In other words, each high voltage level shifter circuit and corresponding pass circuit are pitch matched to a respective memory block and therefore avoids unnecessary complexity in the layout of the connections between the high voltage level shifter circuits, pass circuits and the memory blocks.

Figure 4:
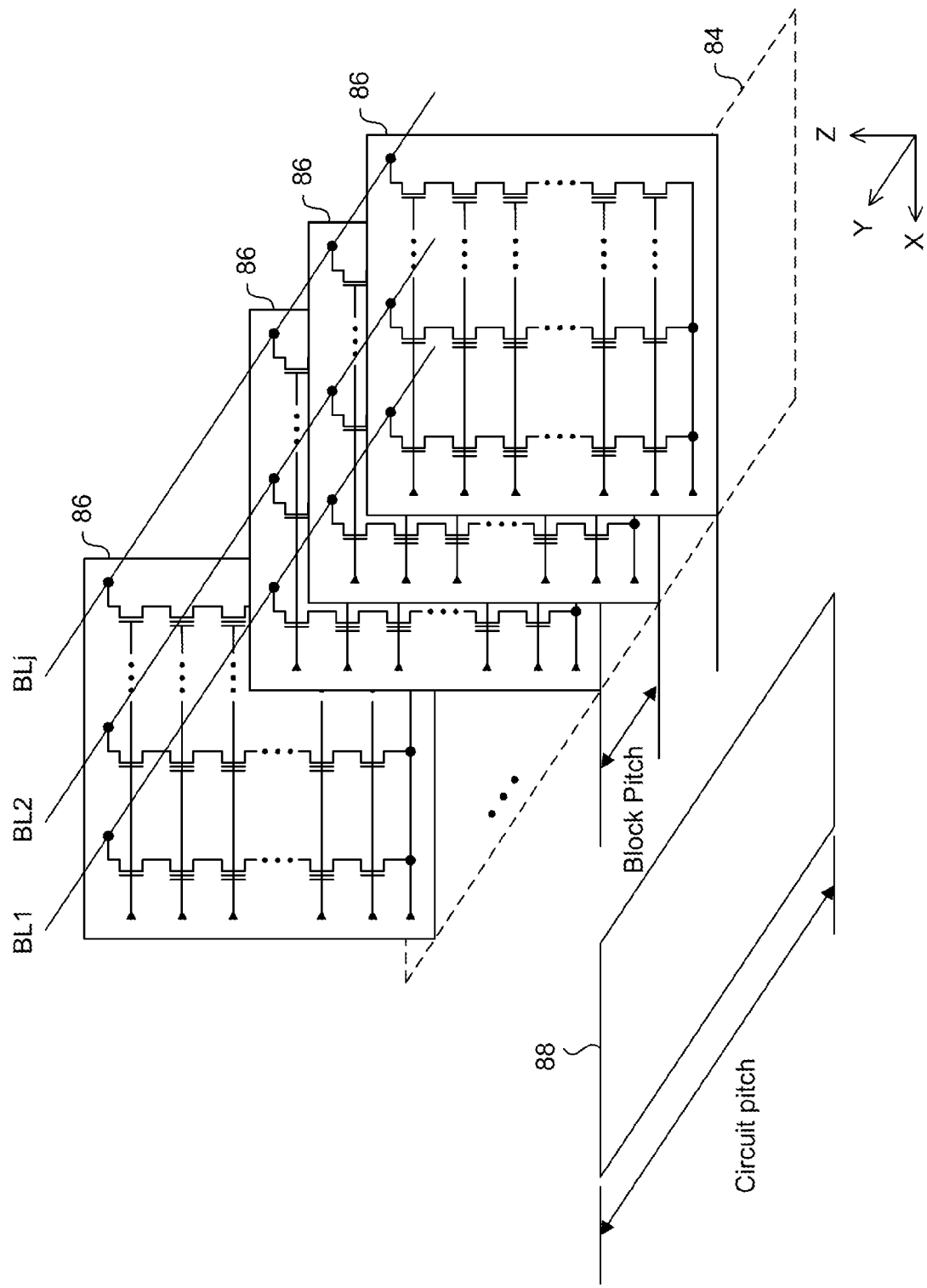
FIG. 4 is a circuit schematic of vertical channel NAND flash memory blocks.

FIG. 4 shows example memory blocks consisting of vertical channel NAND flash memory cell strings. This is one example of a vertically stacked 3D NAND cell string. In such cell strings, the memory cells are formed in a stacked arrangement such that their channels extend in a substantially vertical direction from the semiconductor substrate surface. The substrate surface of the memory device is defined by the plane having the X axis and Y axis as shown in FIG. 4, which includes the memory array region 84 where the NAND flash memory blocks composed of vertical channel NAND cell strings 86 are formed. For ease of illustration, each memory block 86 composed of vertical channel NAND cell strings has the same elements as the planar type NAND flash memory block 52 of FIG. 3, and would thus receive the same row signals shown in FIG. 3. The memory blocks 86 can be seen as planar memory block 52 having its bitline end flipped upwards by 90 degrees. Therefore, the memory cell strings of memory blocks 86 extend in the z axis relative to the x-y plane of the substrate surface.

As shown in FIG. 4, the block pitch between adjacent memory blocks 86 is approximately the Y-axis spacing of a physical vertical channel NAND flash cell. It is noted that the memory blocks 86 are represented as thin sheets and are not drawn to scale. Because of the reduced block pitch size, it is no longer possible to maintain pitch matching with corresponding high voltage level shifter and pass circuits. For example, the high voltage level shifter may include large charge pumps. For comparison purposes, the outline 88 represents the area occupied by a high voltage level shifter circuit and pass circuit corresponding to one memory block similar to the ones shown in FIG. 3, assuming the physical size of a vertical channel NAND cell is similar to that of a planar NAND cell. It is clear from FIG. 4 that pitch matching between each memory block and corresponding high voltage level shifter circuit and pass circuit is not possible. As a result, complex layout of the row decoder circuit elements will increase design cost, and result in non-uniform wiring lengths as signal lines associated with each memory block may be routed from circuits positioned at varying distances from the respective memory block.

Figure 5:
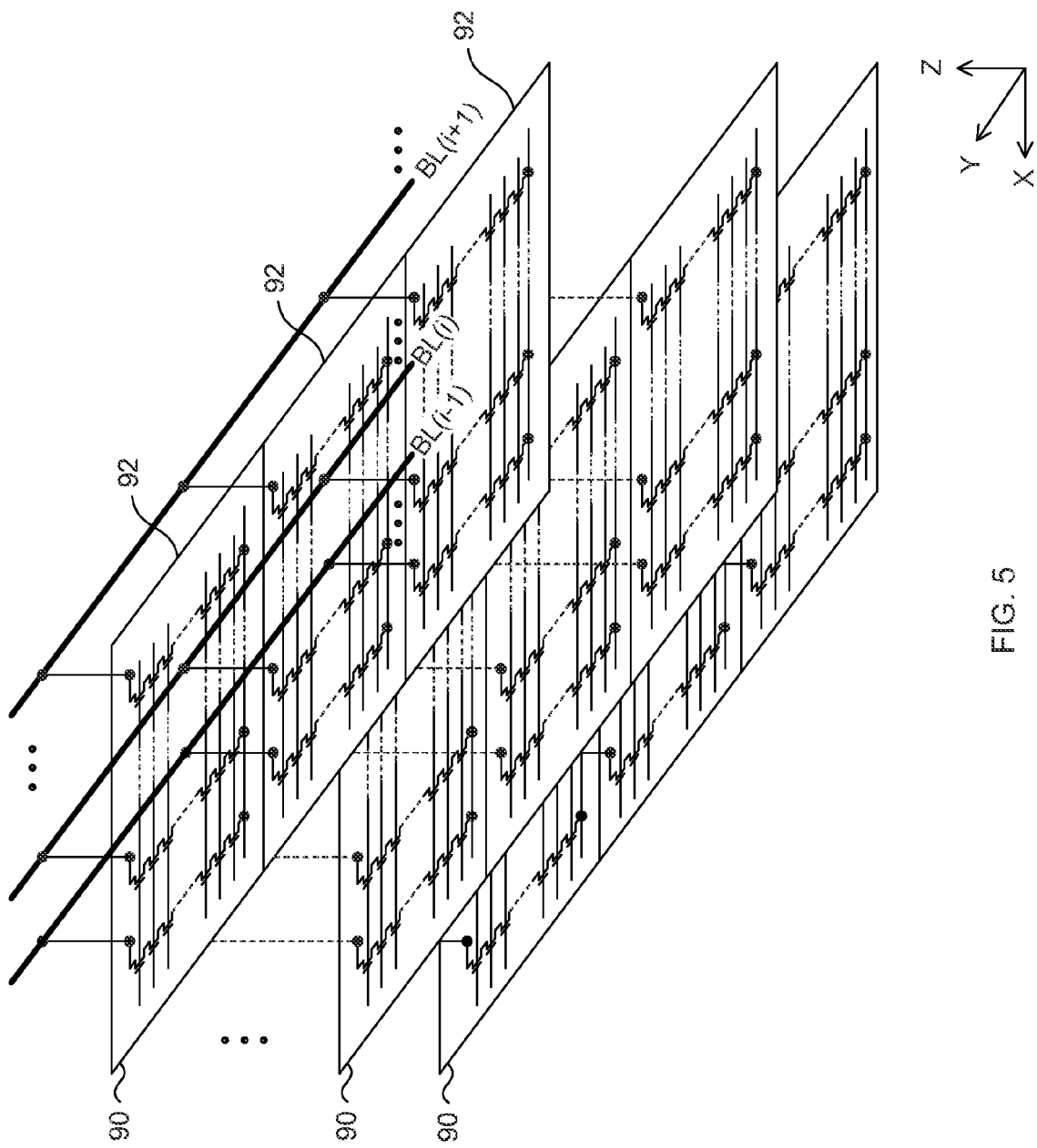
FIG. 5 is a circuit schematic of a vertically stacked NAND flash memory blocks.

While FIG. 4 shows one example of a 3D memory array, FIG. 5 is a circuit schematic of another type of 3D memory array. FIG. 5 shows vertically stacked NAND flash memory blocks with horizontal alignment of NAND cell strings. More specifically, a group of memory blocks 92 are formed in sheets 90, shown as x-y planes. Each memory block 92 consists of type NAND cell strings arranged similarly to those shown in FIG. 3. Each sheet 90 is stacked on top of other in the z axis direction.

Figure 6:
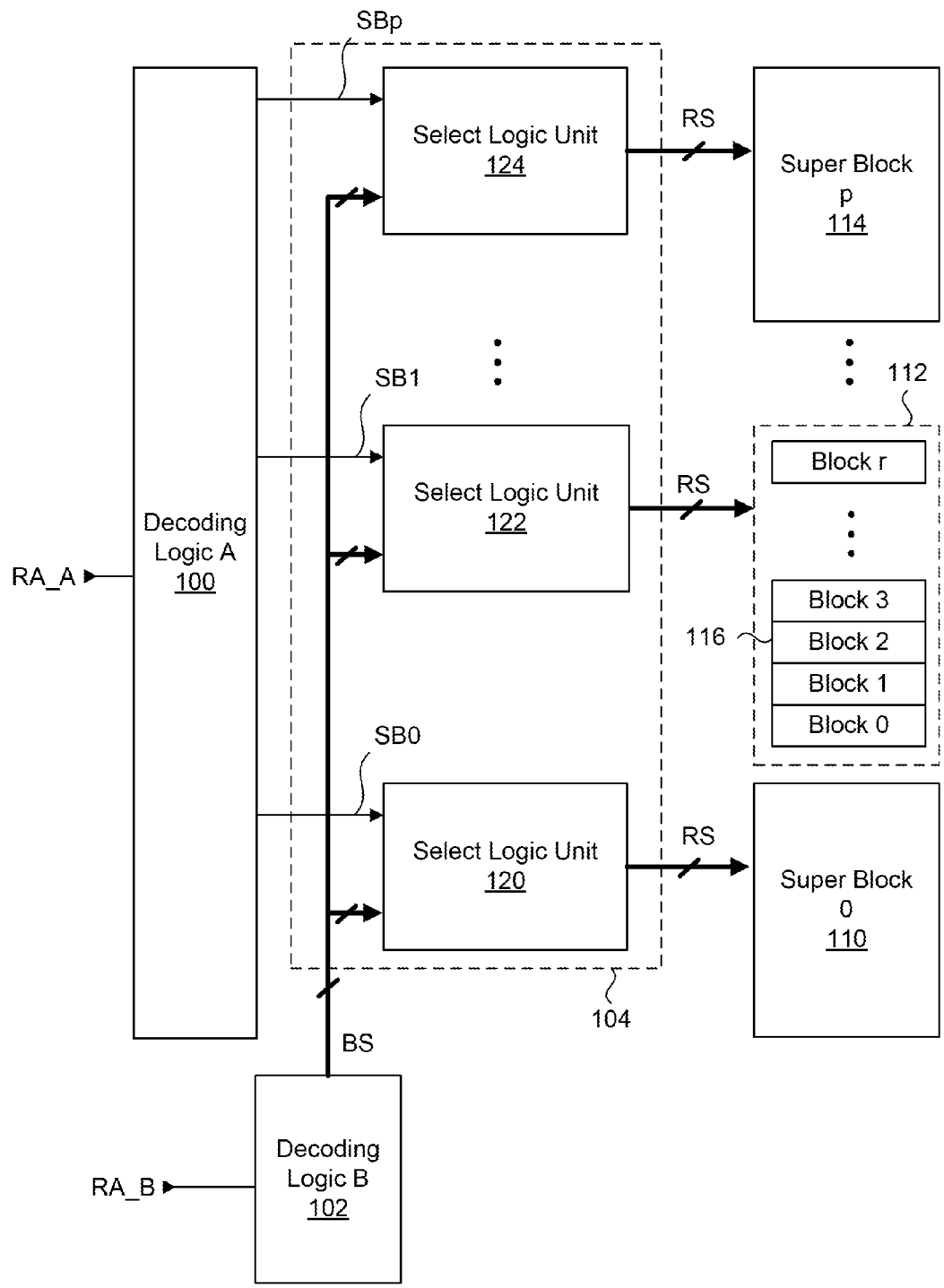
FIG. 6 is a block diagram of a split block row decoder, according to an embodiment of the present disclosure.

According to an embodiment of the present disclosure, a split block decoding scheme is used to hierarchically select a memory block of the memory array to access for read, program or erase operations, which allows for a simplified layout of row decoding circuits that maintains consistent signal line lengths for each memory block. FIG. 6 is a block diagram of a split block row decoder according to an embodiment of the present disclosure. The split block row decoder includes first decoding logic 100, second decoding logic 102, and a select block 104. The memory array includes super blocks 110 and 112 to 114, where the first super block is shown as Super Block 0 and the last superblock is shown as Super Block p, where p is an integer value greater than 0. As shown in super block 112, each super block includes memory blocks 116, where a first memory block of a super block is shown as Block 0 and the last memory block of a super block is shown as Block r, where r is an integer value greater than 0. While not shown in FIG. 6, bitlines extending in a vertical direction are connected to the NAND cell strings of every memory block 116 of all the super blocks. The memory blocks 116 can include a plurality of planar type NAND cells such as those shown in FIG. 3, or vertically stacked cells such as the vertical channel NAND cells of FIG. 4 or the vertically stacked NAND flash memory blocks with horizontal alignment of NAND cell strings of FIG. 5.

It is first assumed that the memory device receives a row address, which is divided into a first row address RA_A and a second row address RA_B. The first decoding logic 100 decodes a first row address RA_A to provide super block signals SB0 and SB1 to SBp. The first row address RA_A can be a number of higher order bits of the row address provided to the memory device. Therefore in operation, one of the super block signals is driven to the active logic level in response to RA_A. The second decoding logic 102 decodes a second row address RA_B to provide block signals BS for accessing one specific memory block of a selected super block. The second row address RA_B can be a number of lower order bits of the row address provided to the memory device. According to one embodiment, the block signals BS can include block select signals, and row signals received by the NAND cell strings of the selected memory block.

The select block 104 receives the super block signals SB0 and SB1 to SBp and the block signals BS for selecting one super block and one memory block of the selected super block. In the present embodiments, a memory block is selected when its NAND cell strings receives the row signals driven to voltage levels necessary for any specific operation, such as read and program operations. In the presently shown embodiment of FIG. 6, the select block 104 includes select logic units 120 and 122 to 124, where each select logic unit can provide local row signals RS to one super block. By example, select logic unit 120 corresponds to super block 110, and provides local row signals only to super block 110. Each select logic unit selects a respective super block in response to the received super block signal, such as SB0 for select logic unit 120, and provides local row signals RS to a specific memory block of the selected super block in response to the block signals BS. It is noted that the block signals BS are received in parallel by all the select logic units 120 and 122 to 124. Therefore, only the select logic unit receiving an active logic level super block signal SB provides local row signals RS to the specific memory block of the selected super block. By example, if SB1 is active in response to RA_A, then select logic unit 122 is enabled. In response to the block signals BS, the select logic unit 122 provides row signals of the block select signal to a specific memory block 116 of super block 112. In the present embodiment, the local row signals RS are provided in the set of block signals BS, which can further include specific memory block addressing information.

In the embodiment of FIG. 6, the row circuits, such as the select logic units 120 and 122 to 124, can be formed within the row pitch of each respective super block 110 and 112 to 114. This is advantageous if the memory blocks 116 are formed with vertical channel NAND cell strings having a row pitch approximately the spacing of a single physical cell. The second decoding logic 102 circuits can be formed in an area of the chip that is not constrained by the row pitch of any super block or memory block. This area between the super blocks and the first decoding logic 100 can be referred to as a row pitch limited area. Therefore, only the row circuits driving signals where signal line length should be minimized remain within the row pitch of a corresponding super block.

Figure 7:
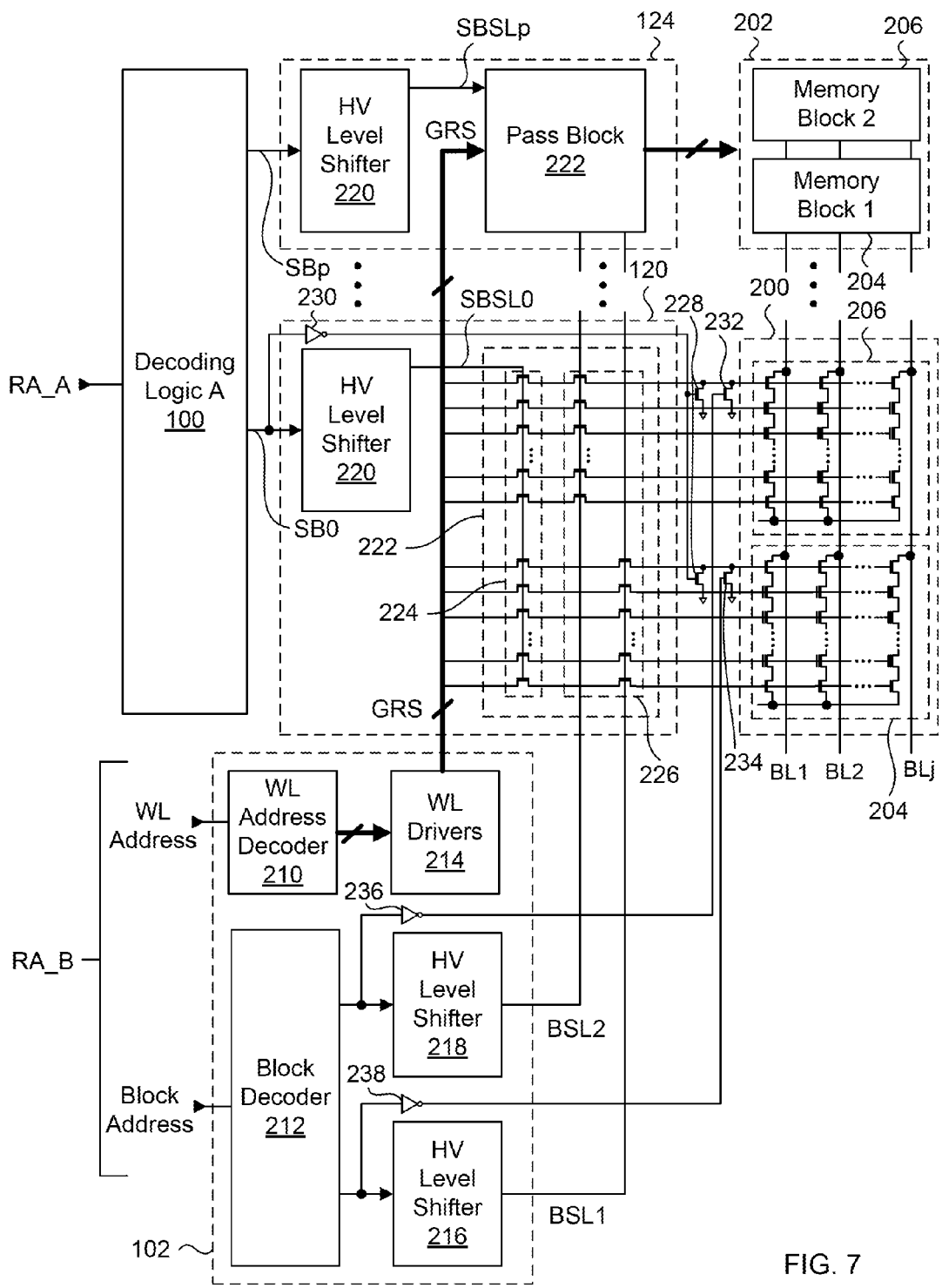
FIG. 7 is an example embodiment of the split block row decoder of FIG. 6, according to an embodiment of the present disclosure.

FIG. 7 shows an example of the split block decoding scheme embodiment of FIG. 6. In order to simplify the schematic, the memory array is shown by a first super block 200 and a last super block 202, and each of the super blocks includes a first memory block 204 and a second memory block 206. Bitlines BL1, BL2 and a last bitline BLj are shown connected to the NAND cell strings of the memory blocks 204 and 206 of all the super blocks. The memory blocks 204 and 206 can include a plurality of planar type NAND cells such as those shown in FIG. 3, or vertically stacked cells such as the vertical channel NAND cells of FIG. 4 or the vertically stacked vertically stacked NAND flash memory blocks with horizontal alignment of NAND cell strings of FIG. 5. FIG. 7 shows example electrical connections between the split block decoding circuits and the super blocks and memory blocks, and does not restrict the embodiment to the specifically shown physical layout or spatial geometry. The split block decoder of FIG. 7 includes the same first decoding logic 100 of FIG. 6, and receives super block address information via first row address RA_A to provide super block signals SB0 to SBp. The second decoding logic 102 is shown to include a wordline address decoder 210, a block decoder 212, wordline drivers 214 and high voltage level shifters 216 and 218.

The wordline address decoder 210 receives wordline address information to provide row signals driven by wordline drivers 214 as global row signals GRS, which include global word lines, a string select line and a ground select line. The wordline address decoder 210 and the wordline drivers 214 can be configured in the same way as wordline address decoder 80 and wordline drivers 82 of FIG. 3. The block decoder 212 receives block address information to provide block select signals that are shifted to a high voltage level by high voltage level shifters 216 and 218. It is assumed in this example that each super block 200 and 202 includes two memory blocks, to better facilitate an understanding of the present disclosure. Accordingly, the high voltage level shifters 216 and 218 provide global block select signals BSL1 and BSL2. Both the wordline address information and block address information are provided in the second row address RA_B. It is noted that the super block address and block address information are parsed from the received memory block address portion of the row address received by the memory device. The global row signals GRS and global block select signals BSL1 and BSL2 are collectively referred to as block signals, denoted as BS in FIG. 6.

As only the first super block 204 and the last super block 206 are shown, only the first select logic unit 120 and the last select logic unit 124 corresponding to the first and last super blocks 204 and 206 respectively, are shown in FIG. 7. Both select logic units 120 and 124 each include a high voltage level shifter 220 and a pass circuit 222. The high voltage level shifters 220 have the same function as high voltage level shifters 60 to 66 of FIG. 3, and provide level shifted super block signals SB0 to SBp as super block select signals SBSL0 to SBSLp respectively. Example circuit details of the pass circuit 222 are shown in FIG. 7. Each pass circuit 222 includes a first stage selector 224 and second stage selector 226, each consisting of pass devices shown as n-channel transistors in the presently shown example. The first stage selectors 224 of all pass circuits 222 receives the global row signals GRS in parallel. Each first stage selector 224 selectively connects the global row signals GRS to a respective second stage selector 226. Each second stage selector 222 selectively connects the global row signals GRS received from the first stage selector 224 to one memory block. First stage selector 224 of select logic unit 120 is enabled by SBSL0, while first stage selector 224 of select logic unit 124 is enabled by SBSLp. The second stage selectors 226 of all the select logic units 120 to 124 receive global block select signals BSL1 and BSL2 in parallel.

Because there are two memory blocks 204 and 206 per super block in the example embodiment of FIG. 7, the second stage selectors 226 of select logic units 120 to 124 include two sub-sets of selectors. Each of the sub-sets of selectors selectively passes the global row signals GRS received from a first stage selector 224 to one of memory blocks 204 and 206 in response to either BSL1 or BSL2. As shown in the example of FIG. 7, one sub-set of selectors of second stage selectors 226 comprise pass devices shown as n-channel transistors having gate terminals connected to BSL1, and another sub-set of selectors comprise similar pass devices having gate terminals connected to BSL2. This connection configuration is repeated for all the pass circuits 222.

Therefore, through the combination of first decoding logic 100 and block decoder 212 of second decoding logic 102, one memory block out of the multitude of memory blocks which constitute the cell array is selected. More specifically, the first decoding logic 100 controls the first stage selectors 224, through which one super block out of the multitude of super blocks is selected. The block decoder 212 controls the second stage selectors 226, through which one memory block is selected out of the multitude of memory blocks which constitute the selected super block. Accordingly, each word line, string select line and ground select line of the selected memory block is connected to its global word line, string select line and ground select line through a series of two sets of pass devices, one which corresponds to first stage selector 224 and another which corresponds to second stage selector 226.

Each super block has two sets of discharge devices connected to the string select lines of the constituent memory blocks. Details of these discharge devices are shown in super block 200. A first set of discharge devices 228 are connected to the string select lines of every memory block of super block 200. The discharge devices 228 are shown in the present example as n-channel transistors, which are connected to VSS. The gate terminals of all discharge devices 228 are connected to a common discharge enable signal that is related to the super block signal corresponding to super block 200. More specifically for the row decoding configuration example of FIG. 7, the common discharge enable signal is an inverted version of super block signal SB0, provided by inverter 230. A second set of discharge devices are connected to the same string select lines that the first discharge devices 228 are connected to. In the present embodiment, the second set of discharge devices includes n-channel transistors 232 and 234. Unlike discharge devices 228, each discharge device 232 and 234 is individually controlled by a local discharge enable signal. For the present row decoding configuration example of FIG. 7, each local discharge enable signal is related to a block select signal provided by block decoder 212. Therefore discharge device 232 receives a local discharge enable signal that is an inverted version of one block select signal, provided by inverter 236, and discharge device 234 receives another local discharge enable signal that is an inverted version of a second block select signal, provided by inverter 238.

It can thus be seen that unlike the block address decoder 58 of FIG. 3, the first decoding logic 100 of FIG. 7 does not decode the memory block address down to the level of the individual memory blocks, but only down to the level of the super blocks. To illustrate the relationship between split super block and memory block addressing, an example is now discussed where it is assumed there are $2^3$ memory blocks per super blocks 200 to 202 of FIG. 7. If the memory block address provided to the memory device consists of s bits, then only s−3 most significant bits of the memory block address are decoded by first decoding logic 100, but not the 3 least significant bits of the memory block address. The s−3 most significant bits of the memory block address are referred to as the super block address. From this follows that each super block output (SB0 to SBp) of the first decoding logic 100, and the respective super block selection signals SBSL0 to SPSLp from the high voltage level shifters 220 select one super block in its entirety, but not individual memory blocks within this super block. Super block selection is achieved by activating one first stage selector 224 of one select logic unit, such as select logic unit 120 for example.

The 3 least significant bits of the memory block address not decoded by first decoding logic 100 are decoded by block decoder 212 to select one memory block out of all memory blocks in each super block. These 3 least significant bits of the memory block address are referred to as a block address. It is assumed that block decoder 212 is configured to provide the appropriate number of outputs based on a $2^3$ memory block selection. As for first decoding logic 100, one output of block decoder 212 is shifted to a high voltage level, such as through high voltage level shifters 216 and 218 for example, in response to the decoding of these 3 least significant bits of the memory block address. Then one selector sub-set of second stage selector 226 corresponding to one memory block in all select logic units 120 to 124 is activated. However, because only one first stage selector 224 of all select logic units 120 to 124 is activated or enabled, only the memory block of the selected super block receives the global row signals GRS. In summary, the first stage selectors 224 function as a first demultiplexor for distributing GRS to one selected super block, and the second stage selector 226 of the selected super block functions as a second demultiplexor for further distributing GRS from the first demultiplexor, to the selected memory block of the selected super block.

It is noted that for an unselected super block, the SSL lines for connecting the NAND cell string to the bitline is held at VSS by a discharge devices 228. Each discharge device 228 is turned on whenever the corresponding super block is unselected, in order to decouple the NAND strings of all the constituent memory blocks from the bitlines. Hence, the discharge devices 228 are turned off for a selected super block. For example, if a super block select signal is driven to an active high logic level to select a particular super block, then the corresponding discharge devices 228 of the super block are turned off. Otherwise, the super block select signal at an inactive low logic level turns on the discharge devices 228. The second discharge devices 232 and 234 are used to discharge SSL lines of unselected memory blocks of a selected super block to VSS. As previously discussed, a selected super block will have one selected memory block. Therefore the remaining memory blocks of the selected super block are unselected and their SSL lines are discharged to VSS.

For the purposes of simplifying the drawing of FIG. 7, the discharge devices 228, 232 and 234 and inverter 230 are shown only for super block 200, but would be included for the other super blocks in the memory array. In an optional configuration, the GSL lines can be discharged using two sets of discharge devices connected in the same way as shown for discharge devices 228, 232 and 234. Alternately, just one set of discharge devices corresponding to discharge devices 228 or 232 and 234 can be included.

Figure 8:
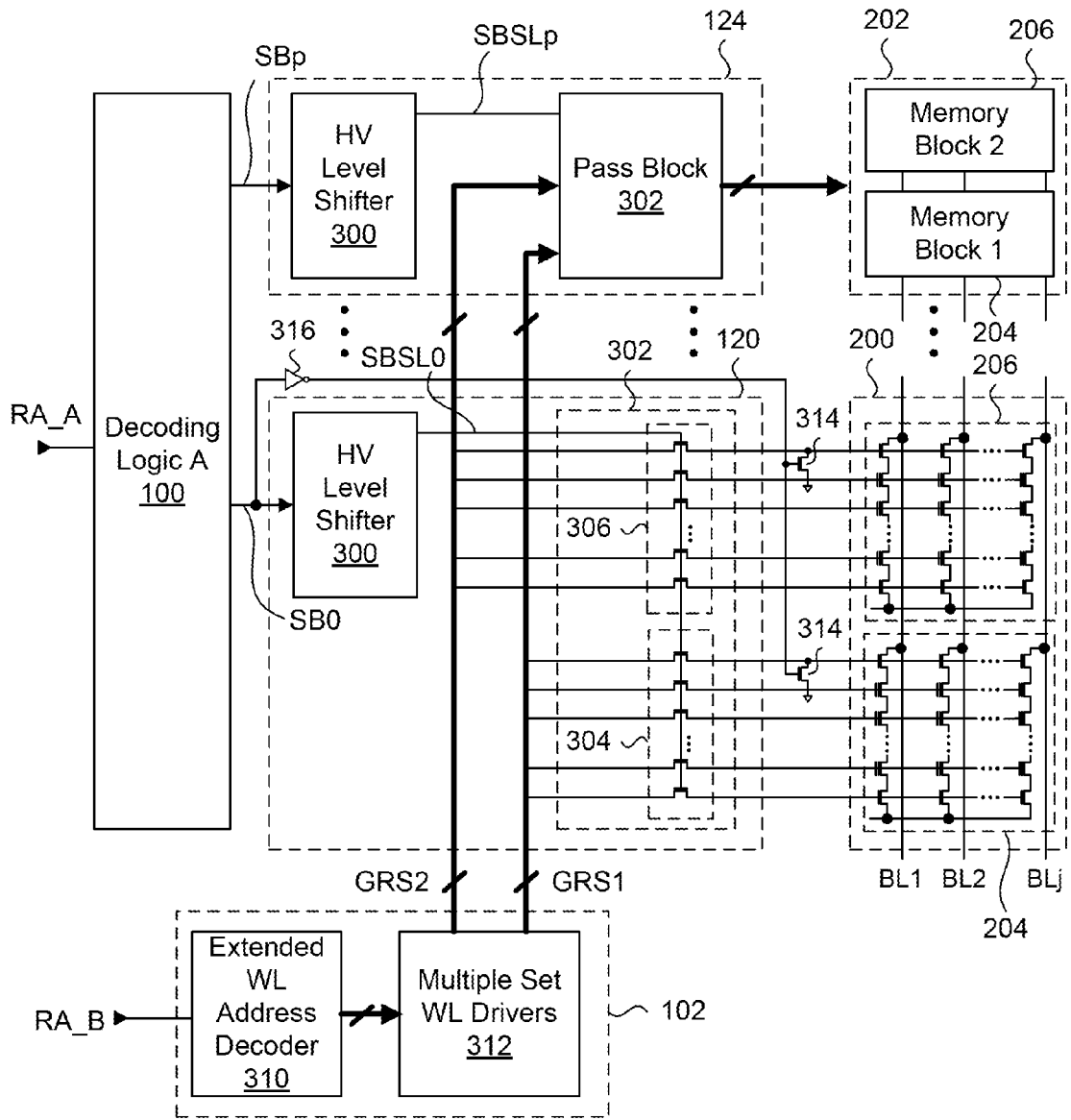
FIG. 8 is an alternate example embodiment of the split block row decoder of FIG. 6, according to an embodiment of the present disclosure.

FIG. 8 shows an alternate example of the split block decoding scheme embodiment of FIG. 6 where the pass circuit of the select logic units are simplified and the number of pass devices is reduced relative to the embodiment of FIG. 7. In the embodiment of FIG. 8, the first decoding logic 100, the memory array super blocks 200, 202 and memory blocks 204, 206 are the same as those shown in the embodiment of FIG. 7. The memory blocks 204 and 206 can include a plurality of planar type NAND cells such as those shown in FIG. 3, or vertically stacked cells such as the vertical channel NAND cells of FIG. 4 or the vertically stacked NAND flash memory blocks with horizontal alignment of NAND cell strings of FIG. 5. As is now described for FIG. 8, the configuration of second decoding logic 102 and select logic units 120 to 124 differs from those shown in FIG. 7.

Each of select logic units 120 to 124 includes a high voltage level shifter 300 and a pass circuit 302, where details of one pass circuit 302 is shown in select logic unit 120. In the embodiment of FIG. 8, pass circuit 302 includes a single stage selector including two sets of pass devices 304 and 306 shown as n-channel transistors. In the present embodiment, each set of pass devices receives and provides a dedicated set of global row signals to a corresponding memory block. As shown in FIG. 8, a first set of pass devices 304 provides a first set of global row signals GRS1 to memory block 204 and a second set of pass devices 306 provides GRS a second set of global row signals GRS2 to memory block 206. Each set of global row signals includes at least dedicated string select, wordline and ground select signals. In alternate configurations where each super block includes more than two memory blocks, the pass circuit 302 would include a corresponding number of sets of pass devices electrically coupled to each memory block, each receiving a dedicated set of global row signals.

The high voltage level shifters 300 have the same function as the previously described high voltage level shifters 220 for the embodiment of FIG. 7. In other words, in response to a first row address RA_A consisting of higher order bits of the received memory block address, one of select logic units 120 to 124 is selected via super block signals SB0 to SBp and super block select signals SBSL0 to SBSLp respectively. In the embodiment of FIG. 8, each super block select signal SBSL0 to SBSLp concurrently enables both pass device sets 304 and 306 of a selected select logic unit. Each of the sets of global row signals GRS1 and GRS2 is provided by the second logic decoding logic 102.

The second decoding logic 102 includes an extended wordline address decoder 310 and multiple set wordline drivers 312, where the wordline drivers 312 receives different voltage levels, some of which are greater than the power supply voltage provided to the semiconductor memory device, to drive row signals with during read, program and erase operations. The extended wordline address decoder 310 differs from the wordline address decoder 210 of FIG. 7 in that it decodes, in addition to the wordline address information, the lower order bits of the memory block address not decoded by the first decoding logic 100. Therefore, the block addresses for memory blocks of each super block is integrated into the decoding logic of extended wordline address decoder 310. In the example of FIG. 8, the extended wordline address decoder 310 decodes the wordline address information and the lower order bits of the memory block address to provide dedicated sets of global row signals for each memory block of a super block. In otherwords, the second decoding logic 102 of FIG. 8 outputs as many global word lines, string select lines and ground select lines as there are local word lines, string select lines and ground select lines in the entirety of one super block. By example, the extended wordline address decoder 310 can include multiple identically configured sets of wordline decoding logic, of which only one is activated in response to the lower order bits of the memory block address.

For example, if each super block 200 to 202 consists of 8 blocks each having NAND cell strings receiving 16 word lines, 1 string select line and 1 ground select line, the total number of global row signal lines output by the second logic decoding logic 102 is 8×16=128 global word lines, 8 global string select lines and 8 global ground select lines. Out of these sets of lines, only the set of lines corresponding to the selected block are activated, or driven to the required voltages for the specific operation being executed. For ease of illustration, the example embodiment of FIG. 8 shows two memory blocks per super block, therefore the second logic decoding logic 102 provides two dedicated sets of global row signals GRS1 and GRS2. Each select logic unit receives all sets of the global row signals, therefore no additional decoding is needed to select the correct memory block because only those global row signals activated by the extended wordline address decoder 310 and the multiple set wordline drivers 312 for the selected memory block are driven. Accordingly, when a super block select line (SBSL0 to SBSLp) is activated, the corresponding single stage selector 302 is enabled to pass the active set of global row signals (GRS1 or GRS2) to the corresponding memory block 204 or 206. Therefore the embodiment of FIG. 8 does not require a separate block decoder, such as block decoder 212 of FIG. 7, and a second stage of pass devices, such as second stage selector 226 of FIG. 7.

In the embodiment of FIG. 8, each super block has a set of discharge devices connected to the string select lines of the constituent memory blocks. Details of these discharge devices are shown in super block 200. The discharge devices 314 are connected to the string select lines of every memory block of super block 200. The discharge devices 314 are shown in the present example as n-channel transistors, which are connected to VSS. The gate terminals of all discharge devices 314 are connected to a common discharge enable signal that is related to the super block signal corresponding to super block 200. More specifically for the row decoding configuration example of FIG. 8, the common discharge enable signal is an inverted version of super block signal SB0, provided by inverter 316.

For an unselected super block, the SSL lines for connecting the NAND cell string to the bitline is held at VSS by a discharge devices 314. Each discharge device 314 is turned on whenever the corresponding super block is unselected, in order to decouple the NAND strings of all the constituent memory blocks from the bitlines. Hence, the discharge devices 314 are turned off for a selected super block. For example, if a super block select signal is driven to an active high logic level to select a particular super block, then the corresponding discharge devices 314 of the super block are turned off. Otherwise, the super block select signal at an inactive low logic level turns on the discharge devices 314.

For the purposes of simplifying the drawing of FIG. 8, the discharge devices 314 and inverter 316 are shown only for super block 200, but would be included for the other super blocks in the memory array. In an optional configuration, the GSL lines can be discharged using a set of discharge devices connected in the same way as shown for discharge devices 314.

Figure 9:
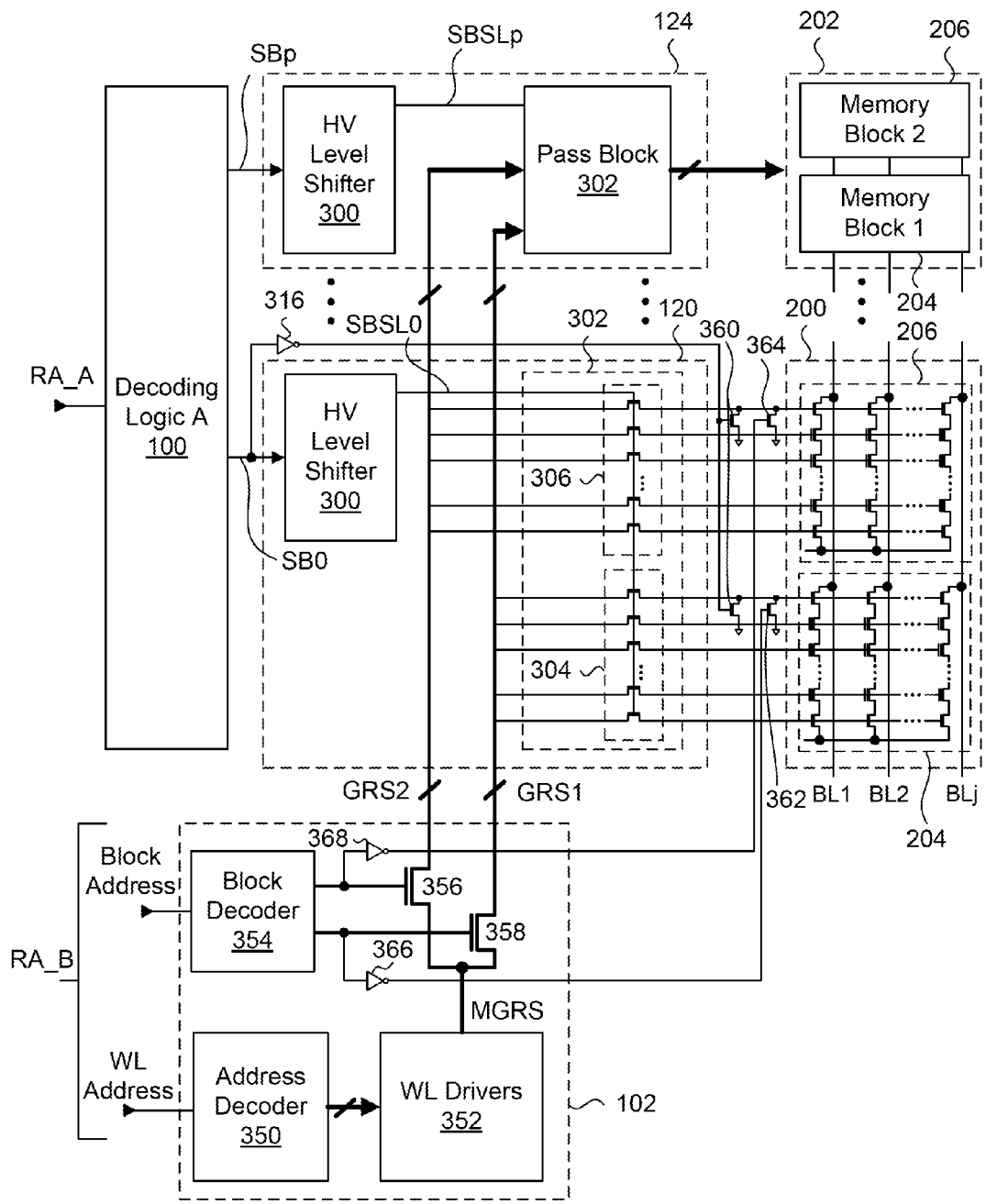
FIG. 9 is an alternate configuration of the split block row decoder of FIG. 8, according to an embodiment of the present disclosure.

FIG. 9 is an alternate example of the split block decoding scheme embodiment of FIG. 8, in which a different configuration of the second decoding logic 102 is presented. Many features previously shown in FIG. 8 appear in FIG. 9 annotated with the same reference numbers. The second decoding logic 102 includes a wordline address decoder 350, a wordline driver circuit 352, a block decoder 354, and a selector circuit including a first set of pass transistors 356 and a second set of pass transistors 358. The wordline address decoder 350 and the wordline driver circuit 352 function the same as corresponding circuits 210 and 214 respectively of the embodiment of FIG. 7, and provides a single set of master global row signals MGRS in response to received wordline address information. The master global row signals MGRS include global word lines, a string select line and a ground select line.

The master global row signals MGRS are received by the pass transistors 356 and 358, which selectively pass MGRS as either global row signals GRS1 or GRS2 in response to block select signals provided by block decoder 354. It is noted that each of pass transistors 356 and 358 represents a group of pass transistors for passing each of the master global row signals MGRS in response to the same block select signal. Accordingly, a memory block of a super block is selected when the corresponding GRS1 or GRS2 lines are electrically connected to MGRS. In configurations where there is more than two memory blocks per super block, there will be the same number of pass transistors for providing global row signals to each memory block. Both the wordline address information and block address information are provided in the second row address RA_B, where the super block address and block address information are parsed from the received memory block address portion of the row address received by the memory device.

Each super block has two sets of discharge devices connected to the string select lines of the constituent memory blocks. Details of these discharge devices are shown in super block 200. In addition to a first set of discharge devices 360 which are configured and operate similarly to discharge devices 228 previously shown in the embodiment of FIG. 7, the embodiment of FIG. 9 includes a second set of discharge devices connected to the same string select lines that the first discharge devices 360 are connected to. In the present embodiment, the second set of discharge devices includes n-channel transistors 362 and 364. Unlike discharge devices 360, each discharge device 362 and 364 is individually controlled by a local discharge enable signal. For the present row decoding configuration example of FIG. 9, each local discharge enable signal is related to a block select signal provided by block decoder 354. Therefore discharge device 362 receives a local discharge enable signal that is an inverted version of one block select signal, provided by inverter 366, and discharge device 364 receives another local discharge enable signal that is an inverted version of a second block select signal, provided by inverter 368.

The operation of the first and second sets of discharge devices is similar to the first and second sets of discharge devices shown in the embodiment of FIG. 7. Each discharge device 360 is turned on whenever the corresponding super block is unselected, in order to decouple the NAND strings of all the constituent memory blocks from the bitlines. Hence, the discharge devices 360 are turned off for a selected super block. For example, if a super block select signal is driven to an active high logic level to select a particular super block, then the corresponding discharge devices 360 of the super block are turned off. Otherwise, the super block select signal at an inactive low logic level turns on the discharge devices 360. The second discharge devices 362 and 364 are used to discharge SSL lines of unselected memory blocks of a selected super block to VSS. As previously discussed, a selected super block will have one selected memory block. Therefore the remaining memory blocks of the selected super block are unselected and their SSL lines are discharged to VSS. For the purposes of simplifying the drawing of FIG. 9, the discharge devices 360, 362 and 364 are shown only for super block 200, but would be included for the other super blocks in the memory array. In an optional configuration, the GSL lines can be discharged using two sets of discharge devices connected in the same way as shown for discharge devices 360, 362 and 364. Alternately, just one set of discharge devices corresponding to discharge devices 360 or 362 and 364 can be included.

Figure 10:
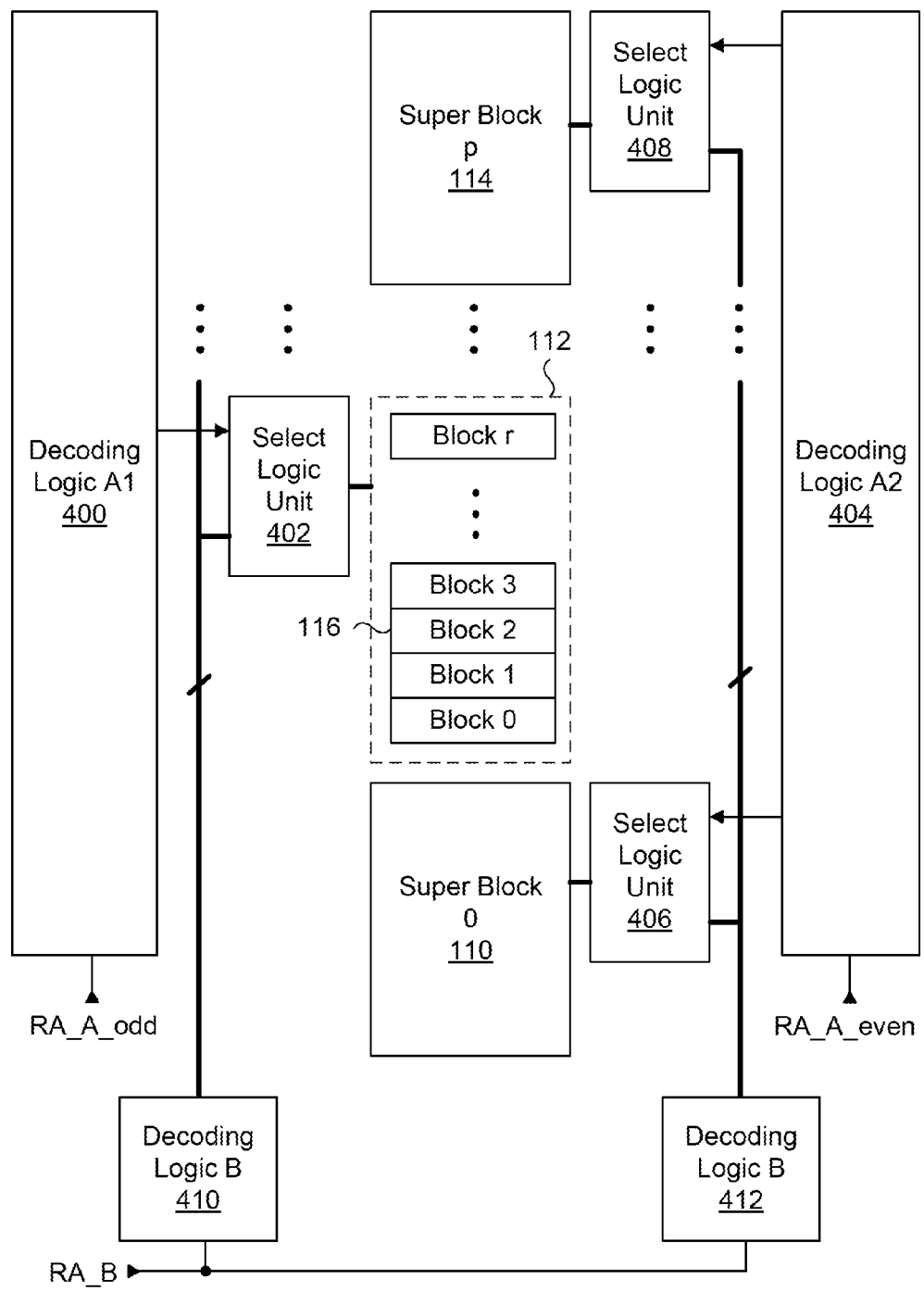
FIG. 10 is a block diagram of a split block row decoder, according to an alternate embodiment of the present disclosure.

The embodiment of FIG. 6 shows an arrangement of the row circuits 120 to 124 of the select block 104 formed on one side of the memory array. According to an alternate embodiment, the row circuits 120 to 124 of the select block 104 can be arranged on both sides of the memory array. FIG. 10 shows such an alternate arrangement of the row circuits, according to the present alternate embodiment.

In FIG. 10, the memory array includes the same super blocks 110 and 112 to 114 as those previously shown in the embodiment of FIG. 6. Formed on one side of the super blocks is a first portion of a first decoder logic 400 and a first portion of select logic units, of which only select logic unit 402 is shown in FIG. 10. Formed on an opposite side of the super blocks is a second portion of a first decoder logic 404 and a second portion of select logic units, of which only select logic units 406 and 408 are shown in FIG. 10. In this example, it is assumed that select logic unit 406 is a first select logic unit, select logic unit 408 is a last select logic unit, and select logic unit 402 is a second and intermediate select logic unit.

It should be noted that select logic units 402, 406 and 408 are formed adjacent to the super blocks they provide row signals to, and starting with the first select logic unit 406, every second select logic unit is formed on an opposite side of the super blocks. This can be referred to as an interleaved row circuit arrangement. Formed outside of a row pitch limited area between the super blocks and the first portion of the first decoder logic 400, and the super blocks and the second portion of the second decoder logic 404, is a first portion of second decoding logic 410 and a second portion of second decoding logic 412. The decoder logic blocks 410 and 412 are shown on either side of the super blocks, but they can be formed underneath or above the memory array of super blocks. In the presently shown example, the decoder logic blocks 410 and 412 are configured identically to each other.

Together, the first portion of the first decoder logic 400 and the second portion of the first decoder logic 404 have the same function as first decoder logic 100 of FIG. 6, except that both portions 400 and 404 are physically subdivided into 2 separate parts. In the presently shown example, the right side select logic units including select logic units 406 and 408 can be considered even numbered select logic units, while the left side select logic units including select logic unit 402 can be considered odd numbered select logic units. Therefore the first portion of the first decoder logic 400 receives a first portion of the first row address RA_A_odd for selecting just the odd numbered select logic units, and the second portion of the second decoder logic 404 receives a second portion of the first row address RA_A_even for selecting just the even numbered select logic units. The first portion of the second decoding logic 410 and the second portion of the second decoding logic 412 both receive a second portion of the row address RA_B.

In one example implementation of the embodiment of FIG. 10, the select logic units 402, 406 and 408 can have the same configuration of select logic unit 120 shown in FIG. 7, and the decoder logic blocks 410 and 412 can each have the same configuration of second decoder logic 102 shown in FIG. 7. In this example, the global row signals provided by second decoder logic block 410 are identical to the global row signals provided by second decoder logic block 412 for selecting the same memory block position in each super block. Therefore the decoder logic blocks 410 and 412 are identically configured to each other.

In another example implementation of the embodiment of FIG. 10, the select logic units 402, 406 and 408 can have the same configuration of select logic unit 120 shown in FIG. 8, and the decoder logic blocks 410 and 412 can each have the same configuration of second decoder logic 102 shown in FIG. 8. In this example, each of second decoder logic blocks 410 and 412 are identically configured to each other. Thus both second decoder logic blocks 410 and 412 provides multiple sets of global row signals, one set for each memory block of a super block, where one set is driven to appropriate voltage levels based on the second row address RA_B for accessing the same memory block position in each super block.

In the embodiment of FIG. 10, it is not necessary to have two physically divided second decoder logic circuits. In an alternate embodiment, both can be formed as a single second decoder logic circuit as shown in the examples of FIGS. 7 and 8 and the sets of global row signals are routed to both sides of the super blocks.

The advantage provided by the embodiment of FIG. 10 is that the row pitch spacing of the select logic units on one side of the super blocks can be greater than the row pitch spacing of a super block. In other words, each select logic unit on one side of the super blocks can extend into the row pitch area of an adjacent super block. This situation may occur if the number of memory blocks 116 per super block is small. For example, if the memory blocks 116 consist of vertical channel NAND cell strings, then a reduction in the number of blocks per super block will reduce the row pitch of a super block. However, it may not be possible to correspondingly reduce the row pitch of the select logic unit. For memory blocks consisting of planar type NAND cell strings, a reduction in the number of memory cells per string may result in the same problem, which can be resolved by the embodiment of FIG. 10.

The embodiments of the disclosure shown in FIGS. 6 to 10 can be applied to memory arrays having memory blocks consisting of planar type NAND cell strings formed on a single plane, or vertically stacked NAND flash memory blocks with horizontal alignment of NAND cell strings, or memory blocks consisting of vertical channel NAND cell strings.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A non-volatile memory device, comprising:
  a memory array including a plurality of memory blocks organized as groups of memory blocks; and
  row decoding circuitry configured to select a group of the plurality of memory blocks in response to a first row address and to select a memory block of the group for receiving row signals in response to a second row address;
  wherein the row decoding circuitry includes first decoder logic configured to provide a super block signal corresponding to each group of the plurality of memory blocks in response to the first row address.

2. The non-volatile memory device of claim 1, wherein the row signals includes string select signals corresponding to each memory block of the group, the non-volatile memory device further including discharge devices for coupling each of the string select signals to ground when the group is unselected.

3. The non-volatile memory device of claim 2, wherein each of the discharge devices is controlled by logic states of the super block signal.

4. The non-volatile memory device of claim 2, wherein the row signals includes ground select signals corresponding to each memory block of the group, the non-volatile memory device further including ground select discharge devices for coupling each of the ground select signals to ground when the group is unselected.

5. The non-volatile memory device of claim 4, wherein each of the ground select discharge devices is controlled by logic states of the super block signal.

6. The non-volatile memory device of claim 1, further including high voltage level shifters for voltage level shifting the super block signals.

7. The non-volatile memory device of claim 2, wherein the row decoding circuitry includes a select logic unit configured to select the group addressed by the first row address and the memory block of the group addressed by the second row address.

8. The non-volatile memory device of claim 7, wherein the select logic unit is formed within a row pitch of the group.

9. The non-volatile memory device of claim 7, wherein the first row address includes higher order bits of a memory block address.

10. The non-volatile memory device of claim 9, wherein the row decoding circuitry includes second decoder logic configured to provide block signals corresponding to each memory block of the group in response to the second row address.

11. The non-volatile memory device of claim 10, wherein the block signals include block select signals corresponding to each memory block of the group, and row signals for accessing memory cells of each memory block of the group.

12. The non-volatile memory device of claim 11, wherein the select logic unit includes
  a first stage selector configured to pass the row signals to a second stage selector in response to the super block signal, the second stage selector being configured to selectively pass the row signals to one memory block of the group corresponding to the super block signal, in response to the block select signals.

13. The non-volatile memory device of claim 12, wherein the discharge devices are first discharge devices, the non-volatile memory device further including second discharge devices, each of the second discharge devices coupling a corresponding string select line to ground when the corresponding memory block of the group is unselected.

14. The non-volatile memory device of claim 13, wherein each of the second discharge devices is controlled by logic states of a corresponding block select signal.

15. The non-volatile memory device of claim 13, wherein the row signals includes ground select signals corresponding to each memory block of the group, the non-volatile memory device further including ground select discharge devices for coupling each of the ground select signals to ground when the corresponding memory block of the group is unselected.

16. The non-volatile memory device of claim 15, wherein each of the ground select discharge devices is controlled by logic states of the corresponding block select signal.

17. The non-volatile memory device of claim 11, wherein the second row address includes a wordline address and lower order bits of the memory block address, the second decoder logic including
 a wordline address decoder for providing the row signals in response to the wordline address, and
 a block decoder for providing the block select signals in response to the lower order bits of the memory block address.

18. The non-volatile memory device of claim 17, wherein the second decoder logic further includes a wordline driver for driving the row signals received from the wordline address decoder, and high voltage level shifters for voltage level shifting the block select signals.

19. The non-volatile memory device of claim 10, wherein the block signals include dedicated sets of row signals corresponding to each memory block of the group.

20. The non-volatile memory device of claim 19, wherein the select logic unit includes a selector configured to couple the dedicated sets of row signals to a corresponding memory block of the group in response to the super block signal.

21. The non-volatile memory device of claim 20, wherein the second decoder logic includes an address decoder for providing the dedicated sets of row signals in response to the second row address, the second row address including a wordline address and lower order bits of the memory block address.

22. The non-volatile memory device of claim 21, wherein the second decoder logic includes wordline drivers for driving one of the dedicated sets of row signals with voltage levels specific to a memory operation.

23. The non-volatile memory device of claim 20, wherein the second decoder logic includes
 a wordline driver circuit for driving master row signals with voltage levels specific to a memory operation,
 a selector circuit for passing the master row signals as one of the dedicated sets of row signals in response to block select signals, and
 a block decoder for providing the block select signals in response to lower order bits of the memory block address.

24. The non-volatile memory device of claim 23, wherein the discharge devices are first discharge devices, the non-volatile memory device further including second discharge devices, each of the second discharge devices coupling a corresponding string select line to ground when the corresponding memory block of the group is unselected.

25. The non-volatile memory device of claim 24, wherein the row signals includes ground select signals corresponding to each memory block of the group, the non-volatile memory device further including ground select discharge devices for coupling each of the ground select signals to ground when the corresponding memory block of the group is unselected.

26. The non-volatile memory device of claim 7, wherein the first decoder logic and the select logic unit are formed on one side of the memory array.

27. The non-volatile memory device of claim 10, wherein the first decoder logic includes a first portion formed on one side of the memory array and a second portion formed on an opposite side of the memory array.

28. The non-volatile memory device of claim 27, wherein the first portion provides a first super block signal for selecting a first group of the memory blocks, and the second portion provides a second super block signal for selecting a second group of the memory blocks.

29. The non-volatile memory device of claim 28, wherein the row decoding circuitry includes
 a first select logic unit formed on the one side of the memory array for selecting the first group of the memory blocks in response to the first super block signal, and
 a second select logic unit formed on the opposite side of the memory array for selecting the second group of the memory blocks in response to the second super block signals.

30. The non-volatile memory device of claim 29, wherein the first select logic unit is configured to select a memory block of the first group in response to the block signals, and the second logic unit is configured to select a memory block of the second group in response to the block signals.

31. The non-volatile memory device of claim 29, wherein the first select logic unit is formed within a row pitch of the first group of the memory blocks, and the second logic unit is formed within a row pitch of the second group of the memory blocks.

32. The non-volatile memory device of claim 29, wherein the first select logic unit has a row pitch spacing greater than a row pitch of the first group of the memory blocks, and the second logic unit has a row pitch spacing greater than a row pitch of the second group of the memory blocks.

* * * * *